United States Patent [19]

Wiedemer

[11] Patent Number: 5,023,834
[45] Date of Patent: Jun. 11, 1991

[54] AUTOMATED EPROM AND EEPROM READING, ERASING, AND WRITING SYSTEM

[76] Inventor: John D. Wiedemer, 930 West Forest Drive, Houston, Tex. 77079

[21] Appl. No.: 249,347

[22] Filed: Sep. 23, 1988

[51] Int. Cl.$^5$ ............................................. G11C 13/00
[52] U.S. Cl. ........................................ 365/52; 365/96
[58] Field of Search ................... 365/94, 95, 96, 52

[56] References Cited

U.S. PATENT DOCUMENTS 3,147,461  9/1964  Mondschein ........................ 365/96

Primary Examiner—Terrell W. Fears
Attorney, Agent, or Firm—Quarles & Brady

[57] ABSTRACT

An arm (18) transfers modules (12), each containing an EPROM or EEPROM, from a feed tray (14) to a conveyor (22). The conveyor (22) has a circuitous series of links, each of which forms a receptacle tray (24) that is adapted to receive one of the modules (12). Each of the receptacle trays (24) have electrodes (42) which are electrically connected to the EPROM or EEPROM. The receptacle trays (24) pass beneath heads (52), each separate head (52) making electrical contact with a separate electrode (42) to process the EPROM or EEPROM. A reading, erasing, or writing process may be accomplished through a particular head or heads (52). As the receptacle trays (24) pass beneath a set of heads (52), the modules (12) are processed in succession. When the receptacle trays (24) complete travel on the conveyor (22), a second arc (26) transfers the modules (12) to a collection tray (30).

13 Claims, 3 Drawing Sheets

AUTOMATED EPROM AND EEPROM READING, ERASING, AND WRITING SYSTEM

FIELD OF THE INVENTION

This invention relates to a method of reading, erasing, and writing upon large numbers of EPROMs or EEPROMs.

BACKGROUND OF THE INVENTION

It may be desired in circuits comprising an erasable programmable read only memory (EPROM) or an electrically erasable programmable read only memory (EEPROM) to read and erase the EPROM or EEPROM, and to write new data into the EPROM or EEPROM. Though this processing may be readily performed for an individual EPROM or EEPROM, the reading, erasing, and writing of mass quantities of the EPROM or EEPROMs may be time-consuming and difficult.

An example of an application that requires such reading, erasing, and writing of data onto or from EPROMs and EEPROMs is a removable memory module used in a high security pay television system, such as is described in U.S. Pat. No. 4,696,034 issued to Wiedemer. Under such a system, the memory module mates with a decoder so that the electronic circuitry of the pay television system can be read from and write to the memory module. The memory module is removable so as to be replaced periodically and then taken to a central billing facility for reading for billing purposes. Where there are many subscribers to such a pay television system, a means of rapidly processing the memory modules is necessary. Such processing includes a reading of program identification codes that have been written into the memory modules, an erasure of the memory module, and a writing of subscriber codes or other information onto a new or newly erased module.

SUMMARY OF THE INVENTION

In accordance with the present invention, a conveyor is adapted to an automated system for reading, erasing, and writing upon EPROMs and EEPROMs. The conveyor has a circuitous series of links, each of the links forming a receptacle tray that is adapted to receive a module which contains an EPROM or EEPROM. Each module has copper strips across its width, which are electrical connections used to process the EPROM or EEPROM, i.e., the connections are used to access the EPROM or EEPROM to read, erase, or write thereupon. The insertion of a module into a receptacle tray forms an electrical connection from the copper strips in the module to electrodes in the receptacle tray. The electrodes are conducting strips which run parallel to the direction of conveyor travel. A computer forms an electrical circuit with the electrodes in order to process the EPROMs or EEPROMs. A head positioned above the conveyor and connected to the computer forms contact with an electrode to form a completed circuit as the conveyor travels underneath. Each of the modules is successively processed as they travel beneath a head. Multiple heads and corresponding electrodes are ordinarily required to perform the desired processing.

It is an object of the system to provide a means of processing a plurality of EPROMs and EEPROMs in an efficient and labor-saving manner.

Further objects, features, and advantages of the invention will be apparent from the following detailed description taken in conjunction with the accompanying drawings.

DESCRIPTION OF THE PREFERRED EMBODIMENT

Figure 1:
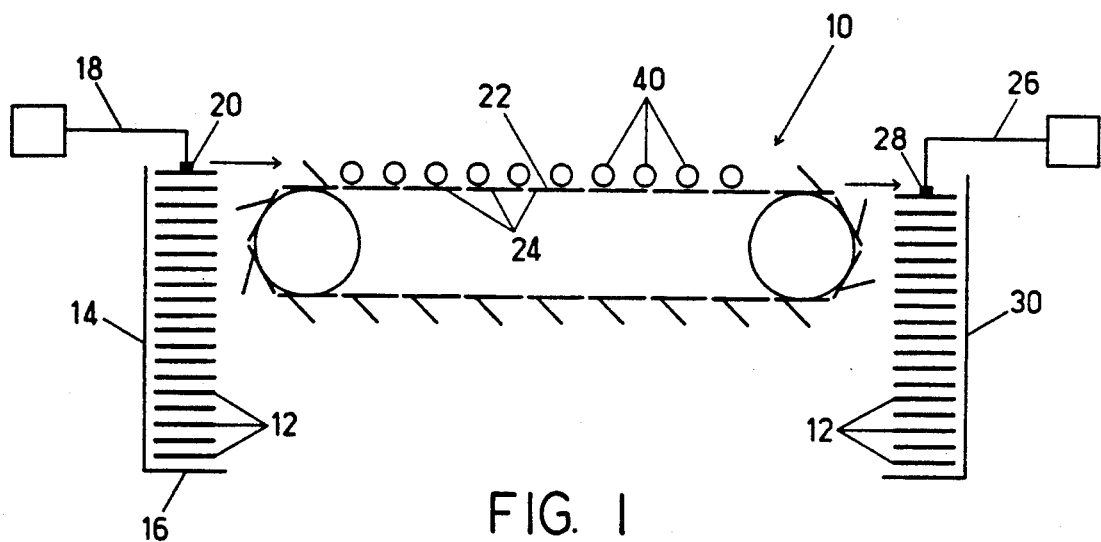
FIG. 1 is a side view of the automated EPROM and EEPROM reading, erasing, and writing system.

With reference to the drawings, FIG. 1 shows an automated EPROM and EEPROM reading, erasing, and writing system at 10. Except where noted, an "EPROM" is herein used to generically refer to an EPROM (erasable programmable read only memory), an EEPROM (electrically erasable read only memory), or an EAROM (electrically alterable read only memory). Modules 12 containing EPROMs or other memory devices are placed in stacked arrangement in a feed tray 14 which has a spring-loaded bottom 16. A cam or servo-operated arm 18 having a pneumatic suction device 20 picks up the modules 12 from the feed tray 14 one at a time and loads them onto a conveyor 22. Each of the modules 12 are loaded into a receptacle tray 24 in a conveyor 22, each of the receptacle trays 24 forming a link in the conveyor 22. The conveyor 22 is formed of a continuous series of receptacle trays 24 which are joined by clevises or other flexure means. The receptacle trays 24 are preferably made of plastic or other non-conducting material. The modules 12 travel across the length of the conveyor 22 via the receptacle trays 24 and are read, erased, or programmed during their passage over the length of the conveyor 22, which is explained further below. At the end of their travel on the conveyor 22, a second arm 26 having a pneumatic suction device 28 individually removes each of the modules 12 as they arrive at the end of their travel on the conveyor 22. The second arm 26 then places the modules 12 in stacked arrangement upon a collection tray 30. Arms such as the arms 18 and 30 are well-known, being used to feed printing presses, among many other uses.

Figure 2:
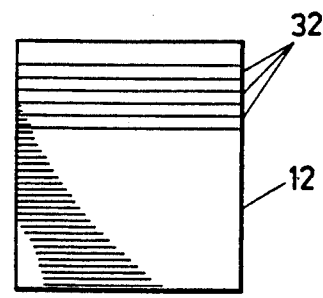
FIG. 2 is a front view of the module.
Figure 3:
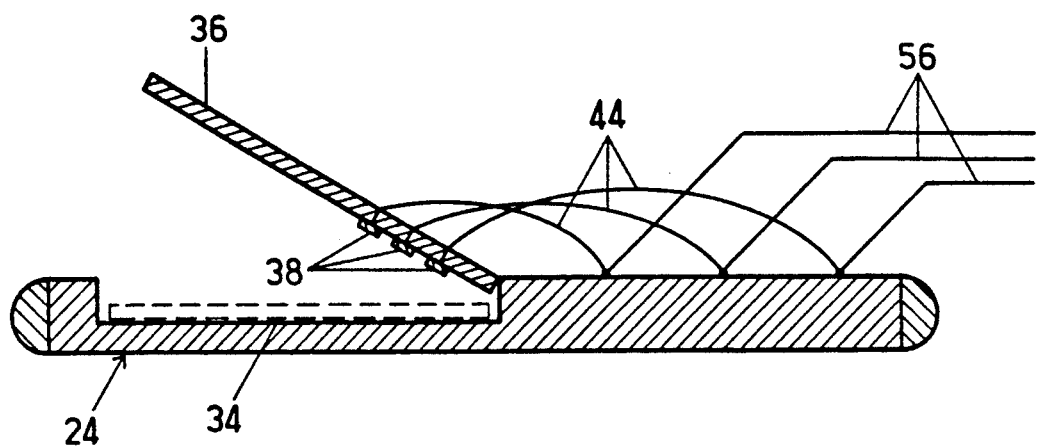
FIG. 3 is a side view of the receptacle tray, the lid being in an open position.

FIG. 2 shows an exemplary module 12 which contains an EPROM. The module 12 has copper strips 32 across its width which act as electrical contacts through which the EPROM in the module 12 is read, erased, and written upon. FIG. 2 shows three copper strips 32, though other numbers are possible. FIG. 3 depicts an individual receptacle tray 24 which, as noted above, doubles as a link in the belt of the conveyor 22. The receptacle tray 24 has a socket 34 into which the module 12 fits. A lid 36 is hinged and spring-loaded in an open position, and is designed to close over the module 12 when the module 12 is positioned within the socket 34. The socket 34 and the lid 36 each have leaf spring contacts 38 which mate and contact with the copper strips 32 of the module 12 when the lid 36 is closed. As shown in FIG. 1, pressure rollers 40 are positioned above the receptacle trays 24. When the receptacle trays 24 travel beneath the pressure rollers 40, the lid 36 is closed to form contact between the copper strips 32 and the leaf spring contacts 38. No pressure rollers 40 are located at the points of transfer of the modules 12 from the feed tray 14 to the conveyor 22 and from the conveyor 22 to the collection tray 30, so that the lids 36 are sprung open at these points to allow the modules 12 to be inserted and removed from their respective receptacle trays 24. Pressure rollers 40 are located across the remainder of the length of the conveyor 22 so that contact is maintained between the leaf spring electrical contacts 38 and the copper strips 32. It should be therefore apparent that the modules 12 must be properly oriented within the socket 34, and therefore must also be stacked in the feed tray 12 with a proper orientation.

Figure 4:
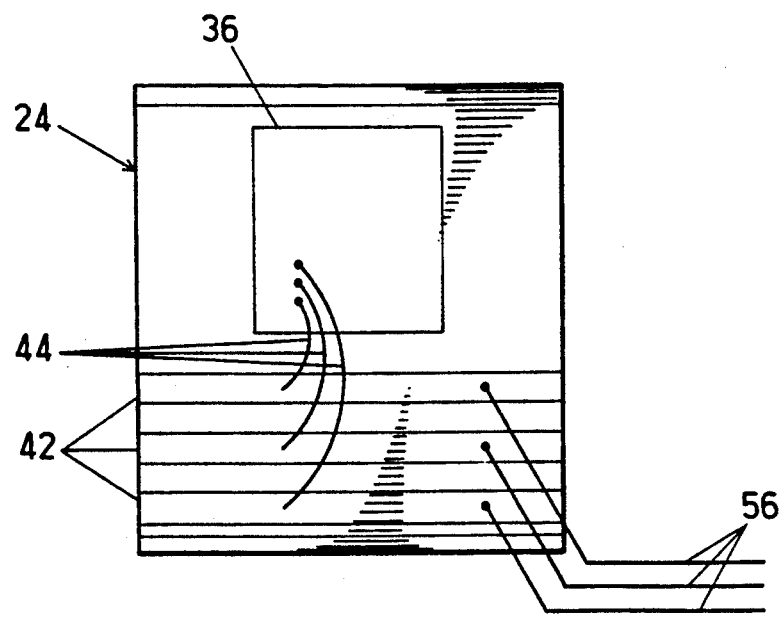
FIG. 4 is a top view of the receptacle tray, the lid being in a closed position.

FIG. 4 shows one of the receptacle trays 24 as viewed from the top, with the lid 36 in a closed position. Wires 44 lead from each of the leaf spring electrical contacts 38 in the lid 36 to a respective electrode 42 in the receptacle tray 24. The wires 44 are attached at the underside of the electrodes 42 and may therefore be partially embedded in the receptacle tray 24. If the leaf spring electrical contacts 38 are located in the socket 34, the wires 44 would be wholly embedded within the receptacle tray 24. The electrodes 42 run the length of the receptacle tray 24, i.e., they are parallel to the direction of travel of the conveyor 22. Each of the copper electrodes 42 on the receptacle tray 24 correspond to one of the copper strips 32 across the width of the module 12. An electrical connection is thus formed from each of the copper strips 32 in a particular module to the respective copper electrode 42 in the receptacle tray 24 via the corresponding wire 44 and leaf spring electrical contact 38 in the lid 36. The number of electrodes 42, then will ordinarily be the same as the number of combined strips 32 on both sides of the module 12, assuming all of the strips 32 of the module 12 are being used in the automated system 10. The number of electrodes 42 which is depicted is therefore exemplary, though dependent on the number of strips 32 in the module 12 being used.

Figure 5:
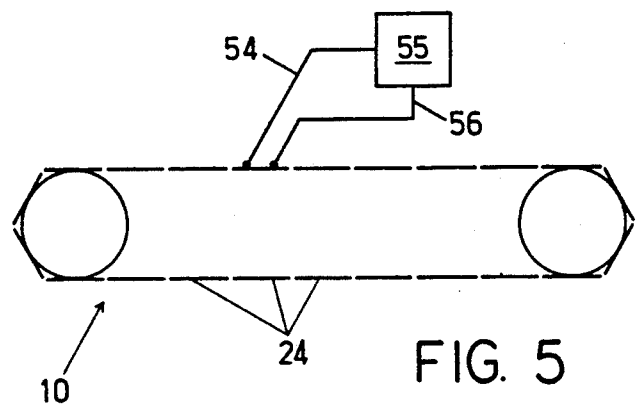
FIG. 5 is a simplified side view of the automated EPROM and EEPROM reading, erasing, writing system, with certain features of FIG. 1 removed to show the computer and the head that reads, erases, and writes.

FIG. 5 shows a simplified side view of the memory module processing system 10. In this case, the pressure rollers 40, the feed and collection trays 14 and 30, and the lids 36 are removed in order to highlight different features. At least one set of heads 52 are positioned to sweep or otherwise make electrical contact with the copper strips 42 of the receptacle tray 24 as the particular receptacle tray 24 passes underneath the heads 52. The heads 52 may be copper rollers, brushes, or other means of forming electrical contact with the copper strips 42. There is one head 52 for each of the copper strips 42. Thus, for the pictured embodiment which shows three distinct parallel copper strips 42, there are a total of three heads 52 in FIG. 5, positioned in direct alignment so that only one may be seen from this view. The heads 52 have wires 54 that lead from each of the electrical contacts 52 to a computer 55. As the receptacle trays 24 pass beneath the electrical contacts 52, the electrical connection is momentarily lost between successive receptacle trays 24.

There is another set of wires 56 shown in FIGS. 3, 4, and 5 which lead from each of the copper strips 42 to the same computer 55. The wires 56 are connected at the underside of the copper strips 42 and embedded in the plastic or other material of the receptacle tray 24 so as not to interfere or snag with the contact between the heads 52 and the copper strips 42 of the receptacle trays 24 as the receptacle trays 24 pass underneath. As noted earlier, the wires 44 are similarly embedded. There are a set of wires 56 for each of the receptacle trays 24 and each of the wires 56 have sufficient slack to allow for complete cycling of the conveyor 22 without loosening the connections of the wires 56 to the copper strips 42. The contact of one of the heads 52 with one of the copper strips 42, and the routing of a wire 56 from that same copper strip 42 to the computer forms a complete electrical connection with the computer 55.

The module 12 as pictured has three copper strips 32 across its width and the receptacle tray 24 has three corresponding copper strips 42 across its length. One of each of the strips 32 together with one of the electrodes 42 form a complete circuit with the computer 55. The circuit is routed from one of the strips 32, through one of the leaf spring electrical contacts 38, through one of the wires 44, to one of the copper electrodes 42 and then through one of the wires 56 to the computer. The circuit also loops from the computer via one of the wires 54 to one of the heads 52 which contact with the same copper strip 42. Each of the separate copper strips 32 for the respective module 12 and the electrodes 42 for the receptacle tray 24 may be used for different processes. For example, one of the copper strips 32 may be used to read data from the EPROM of the module 12, the second copper strip 32 may be used to erase the EPROM of the module 12, and the third copper strip 32 may be used to write upon the EPROM of the module 12. A module 12 need not, however, be limited to three copper strips 32. There may be less than three, for example, erasure may be accomplished by a separate process. For example, a non-electrically erasable EPROM may be erased by exposure to ultraviolet light, an embodiment which will be explained below. Where a separate erasure process is used, then, there may be only two copper strips 32. Conversely, it may be necessary or desirable to use more than one copper strip 32 to perform any of the processes of reading, erasing, or writing upon the EPROM of the module 12. It is to be understood that the EPROM reading, erasing, and writing system may have a different number of circuits formed, depending upon the structure of the module 12 that is to be processed. In the operation of the EPROM reading, erasing, and programming system 10, the modules 12 containing EPROMs are stacked in the feeding tray 14. The modules 12 are removed from the feeding tray 14 by the arm 18 that places the modules 12 upon the receptacle trays 24. The modules 12 are removed in order from the stack contained in the feeding tray 14 and continuously placed on successive receptacle trays 24 as the conveyor 22 is cycled. Upon placement of a module 12 in a particular receptacle tray 24, the lid 36 is open. As the conveyor 22 cycles and the receptacle tray 24 moves down the length of the conveyor 22, the pressure rollers 40 close the lid and maintain contact between the copper strips 32 and the leaf spring electrical contacts 30. As the receptacle trays 24 and their inserted modules 12 travel the length of the conveyor 22, the receptacle trays 24 pass beneath at least one set of heads 52. A circuit is thus formed with a computer which then reads, erases, or writes upon the EPROM of the module 12, or performs any combination of these processes. The circuit is severed between receptacle trays 24 so that the computer may recognize a processing of a different module. When the receptacle tray 24 arrives at the end of the travel upon the conveyor 22, the module 12 contained within the receptacle tray 24 is removed from the receptacle tray 24 by the second arm 26. At this juncture, the lid 36 is again opened because there are no pressure rollers 40 above the lid 36 to keep the lid 36 closed.

Figure 6:
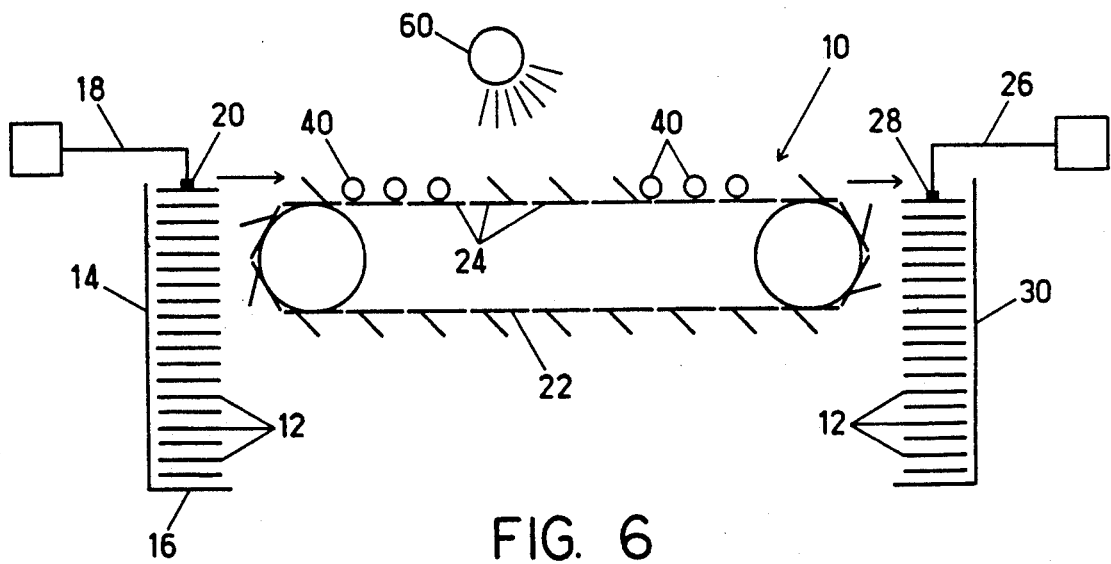
FIG. 6 is a side view of the automated EPROM reading, erasing, and writing system showing an alternate embodiment which employs ultraviolet light to erase the EPROMs.

An alternate embodiment of the present invention is shown in FIG. 6, and enables the system to be used with EPROMs that are not electrically erasable. Stored data in an EPROM can be erased by shining high-intensity ultraviolet light through a special transparent window in the top of the EPROM integrated chip. Erasure is accomplished by the removal of pressure rollers 40 over a length of the conveyor 22 so that the lid 36 opens and exposes the transparent window. An ultraviolet light source 60 is directed to shine upon the window to erase the stored data. In this embodiment, the reading of the module 12 must be accomplished prior to the erasure and so a circuit with the computer 55 that performs the reading must be created before exposure to the ultraviolet light source 60. The head 52 which is associated with the reading processes must be located before the ultraviolet light. Conversely, the head 52 which is associated with the writing process must be located after the ultraviolet light.

The foregoing system could be adaptable to a high security pay television system. A subscriber may forward a module having an EPROM containing the recordation of viewing programs. The modules from all of the subscribers may be stacked and run through the system to prepare a bill, based upon viewer and program identification codes. After reading of the EPROM, this information is erased and new viewer identification codes may be written upon the EPROMs or EEPROMs contained in the modules 12. It may be possible to create variations that fall within the intended scope of this invention. For example, it may be possible to retain the EPROMs or modules in their packaging and perform the necessary processing, provided that the packaging has appropriate access holes to create the necessary electrical contacts. It would be possible to substitute, for example, a system containing a belt, multiple belts, or multiple rollers, which move the modules 12 instead of the conveyor 22. Similarly, magnetic heads may be substituted for heads 52 such as are embodied in the copper strips 32 or 42, in order to process magnetic media modules such as magnetic cards or strips.

It is to be understood, then, that the invention is not confined to the particular construction and arrangement of parts herein illustrated and described, but embraces such modified forms thereof as come within the scope of the following claims.

What is claimed is:

1. A system for processing EPROM modules comprising:
   (a) a conveyor having a circuitous series of links, a plurality of the links having formed in them receptacles into which the modules are inserted, the conveyor moving the links from a first point to a second point so that the modules are moved from the first point to the second point;
   (b) an electrode attached to each of the receptacles, each of the electrodes forming an electrical connection with one of the modules when the modules are inserted into receptacles;
   (c) a head positioned proximate to the conveyor between the first point and the second point and positioned so that the head momentarily contacts with the electrode of each of the receptacles, the head processing each of the modules in succession through the electrical connection in the links as the conveyor moves the links past the head.

2. The system of claim 1 wherein the processing is a reading of the EPROMs in the modules.

3. The system of claim 1 wherein the processing is an erasing of the EPROMs in the modules.

4. The system of claim 1 wherein the processing is a writing of the EPROMs in the modules.

5. The system of claim 1 further comprising an ultraviolet light source positioned to direct ultraviolet light at a pre-selected location between the first point and the second point, the ultraviolet light being directed upon the modules to erase the EPROMs as they are exposed to the ultraviolet light.

6. A method of processing a plurality of EPROM modules comprising the steps of:
   (a) inserting the modules into links of a conveyor, the links each having a receptacle therein adapted to receive a one of the modules therein in mechanical alignment and having electrical connection means to connect to the module:
   (b) conveying the modules in succession from a first point to a second point the conveyor;
   (c) forming electrical contact with the modules as they are conveyed by the conveyor by contacting the electrical connection means on the link with a stationary head; and
   (d) processing information from the modules through an electrical circuit connected to the modules through the head.

7. The method of claim 6 further comprising the step of severing the electrical circuit as the module is conveyed past the head.

8. The method of claim 7 wherein the forming and severing of electrical circuits is accomplished in a continuous manner on successive modules.

9. The method of claim 6 wherein the processing is a reading of the EPROMs in the modules.

10. The method of claim 6 wherein the processing is an erasing of the EPROMs in the modules.

11. The method of claim 6 wherein the processing is a writing of the EPROMs in the modules.

12. The method of claim 6 further comprising the step of directing ultraviolet light upon a pre-selected position between the first point and the second point, to erase the EPROMs as they are exposed to the ultraviolet light.

13. A system for processing information to and from memory modules comprising:
   a conveyor comprising a plurality of links, each link having formed in it a receptacle sized and shaped to receive a module therein, the links also including electrical connection means to connect to the modules;
   motive means for the conveyor to move the links from a first point to a second point;
   (c) a head located adjacent the conveyor between the first and second points, the head making electrical contact with the electrical connection means of the links to make electrical connection therethrough to the modules so that information can be serially read to or from each of the modules as they pass the head.

* * * * *